US006947306B2

(12) United States Patent
Poechmueller

(10) Patent No.: US 6,947,306 B2
(45) Date of Patent: Sep. 20, 2005

(54) BACKSIDE OF CHIP IMPLEMENTATION OF REDUNDANCY FUSES AND CONTACT PADS

(75) Inventor: Peter Poechmueller, Unterhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/674,304

(22) Filed: Sep. 30, 2003

(65) Prior Publication Data

US 2005/0078500 A1 Apr. 14, 2005

(51) Int. Cl.[7] .................................................. G11C 5/06
(52) U.S. Cl. ......................................... 365/63; 51/225.7
(58) Field of Search .............................. 365/63, 51, 52, 365/225.7, 200

(56) References Cited

U.S. PATENT DOCUMENTS 5,064,498 A 11/1991 Miller
5,815,427 A * 9/1998 Cloud et al. .................. 365/51
6,222,212 B1 * 4/2001 Lee et al. ................... 257/207
6,373,127 B1 4/2002 Baudouin et al.
6,400,008 B1 6/2002 Farnworth
6,452,209 B2 9/2002 Vallett
6,643,159 B2 * 11/2003 Fricke et al. ................. 365/51
6,798,679 B2 * 9/2004 Matsumoto et al. .......... 365/52
2002/0141264 A1 10/2002 Mort et al.
2002/0173055 A1 11/2002 Nishio et al.

FOREIGN PATENT DOCUMENTS

JP 60-111450 6/1985

* cited by examiner

*Primary Examiner*—Gene N. Auduong
(74) *Attorney, Agent, or Firm*—Slater & Matsil, L.P.

(57) ABSTRACT

A device having redundant circuit elements is provided with programmable fuse elements on the back surface of the chip. Openings are etched through the chip and connect the circuit elements on the front surface to the fuse elements on the back surface. The fuse elements may be arranged in a grid of lines that are connected to the openings and are read by sequentially activating the lines to activate either a row of fuse elements or a column of fuse elements. Alternatively, bonding pads are provided on the back surface of a chip and are connected to the circuit elements on the front surface of the chip through the openings in the chip.

19 Claims, 2 Drawing Sheets

BACKSIDE OF CHIP IMPLEMENTATION OF REDUNDANCY FUSES AND CONTACT PADS

BACKGROUND OF THE INVENTION

The present invention is directed to electronic devices and, more particularly, to repairable electronic devices that include redundant regions for replacing defective regions of the device, such as the cells of a semiconductor memory device.

Semiconductor memory devices, such as dynamic random access memory devices (DRAMs), typically include a semiconductor memory cell array formed of a plurality of memory cells arranged in rows and columns and include a plurality of bit lines as well as a plurality of word lines that intersect the bit lines. Each memory cell of the array is located at the intersection of a respective word line and a respective bit line and includes a capacitor for storing data and a transistor for switching, such as a planar or vertical MOS transistor. The word line is connected to the gate of the switching transistor, and the bit line is connected to the source or drain of the switching transistor. When the transistor of the memory cell is switched on by a signal on the word line, a data signal is transferred from the capacitor of the memory cell to the bit line connected to the memory cell or from the bit line connected to the memory cell to the capacitor of the memory cell.

As the capacity of semiconductor memory devices increases, the likelihood that a device includes one or more defective memory cells also increases, thereby adversely affecting the yield of the semiconductor memory device manufacturing processes. To address this problem, redundant memory cells are provided which can replace memory cells that are found to be defective during device testing. Typically, one or more spare rows, known as row redundancy, and/or one or more spare columns, known as column redundancy, are included in the memory cell array. The spare rows and/or columns have programmable decoders that can be programmed to respond to the address of the defective row and/or column, known as the fail address, while at the same time disabling the selection of the defective cell. To program the address of a defective memory cell into the programmable decoder, one or more fuses are programmed to represent the respective bits of the fail address by blowing selected ones of the fuses. One of a 0 or 1 value is defined as a fuse in a blown or open state, and the other of the 0 and 1 values is defined as a fuse in an unblown or shorted state.

When an address of a defective memory cell is received, the redundant memory cell is selected so that part or all of the word line or bit line that is connected to the redundant memory cell is substituted for the corresponding portion of a word line or bit line of entire word line or bit line that contains the defective memory cell. As a result, the repaired memory device chip cannot be readily distinguished, at least electrically, from a defect-free chip.

Though semiconductor device elements have become increasingly smaller as the minimum feature size of the device elements has decreased, the total area of the device chip may not significantly decrease because of the presence of other elements on the chip whose size cannot be reduced. As an example, the spacing of the programmable fuse elements described above cannot be reduced below a minimum value, typically 1 $\mu$m, because of the laser cutting used to "blow" the fuse elements. A minimum spot size is needed for the incident laser beam to deliver sufficient energy to blow the fuse. Though beams having smaller spot sizes are possible by reducing the wavelength of the beam, the energy of the beam is also reduced and may not be sufficient to ensure cutting of the fuse. Moreover, as the spot size approaches the wavelength of the beam, the beam is prone to diffraction so that the beam cannot be focused on the fuse element.

Another device element whose size and/or spacing cannot readily be reduced below a minimum size is the bonding pad. When wire bonds are used, the width of the bonding wires and the size of the solder connections cannot be shrunk without risking breakage of the bonding wires, inadequate solder for the connection or misaligned bonding connections. When the bonding pads directly contact the lead frame, such as for a flip chip device, a minimum spacing between leads is also required.

It is nevertheless desirable to reduce the total area of the chip despite the limitations of fuse size and spacing and bonding pad size and spacing.

SUMMARY OF THE INVENTION

The present invention provides a reduction of the total size of the chip by locating the fuses and/or the bonding pads on the backside of the chip and by providing interconnects between circuit elements located on the front side of the chip and the elements located on the backside of the chip.

In accordance with an aspect of the invention, an electronic device is formed in a substrate. A plurality of circuit elements are formed in a first surface of the substrate. The plurality of circuit elements include at least one active circuit element and at least one redundant circuit element. At least one programmable fuse element is formed in a second surface of the substrate. The programmable fuse element stores, when the active circuit element is defective, an indication thereof. At least one interconnect connects the plurality of circuit elements and the fuse element.

According to another aspect of the invention, a memory device is formed in a substrate. Circuit elements are formed in a first surface of a substrate and include active memory cells and redundant memory cells. Programmable fuse elements are formed in a second surface of a substrate and store, when at least one of the active memory cells is defective, an address thereof. A plurality of interconnects connects the plurality of circuit elements and the programmable fuse elements.

According to a further aspect of the invention, an electronic device is formed in a substrate. Circuit elements are formed in a first surface of a substrate. At least one bonding pad is formed in a second surface of a substrate. At least one interconnect connects the plurality of active circuit elements and the bonding pad.

The foregoing aspects, features and advantages of the present invention will be further appreciated when considered with reference to the following description of the preferred embodiments and accompanying drawings.

DETAILED DESCRIPTION

Figure 1:
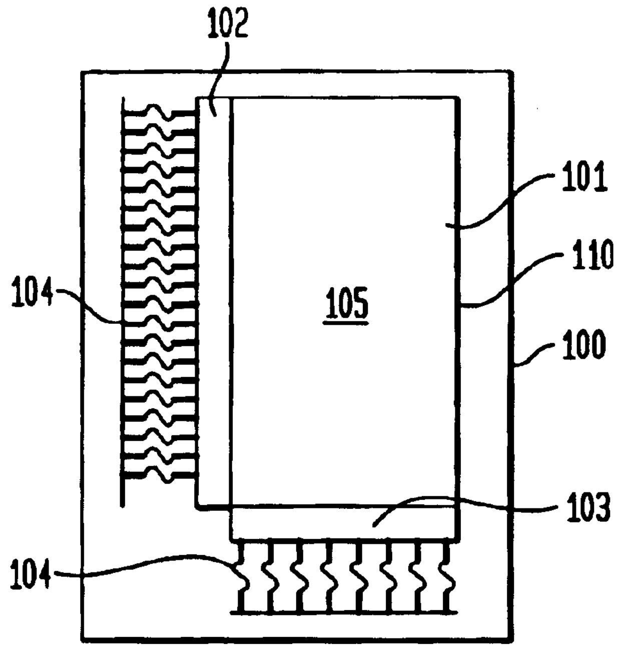
FIG. 1 is a diagram showing a top plan view of a front surface of a known memory circuit chip.

FIG. 1 shows an example of a known DRAM circuit 110 formed in a top surface of a chip 100 that includes a memory cell array 105. The memory cell array 105 is formed of plural word lines and plural bit lines. Also provided are redundant bit lines or redundant word lines that may be used to replace corresponding portions of defective bit lines or defective word lines.

The DRAM 110 writes data to or reads data from respective memory cells of the memory cell array 105 as a function of received row and column addresses. Specifically, a control circuit (not shown) receives, via an address bus (not shown), the row and column address of at least one cell of the memory cell array 105 that is to be accessed. The control circuit then delivers the row address to a row decoder section 102 that drives a selected word line based on a row address signal and delivers the column address to a column decoder section 103 that drives a selected bit line as a function of a column address signal.

A plurality of fuses 104 is programmed to represent the respective bits of the fail addresses by defining one of a 0 or 1 value as a fuse in a blown or open state, and the other of the 0 and 1 values as a fuse in an unblown or shorted state. When the row decoder section 102 receives a row address or the column decoder section 103 receives a column address that the stored fail address information indicates is defective, the row decoder section 102 or the column decoder section 103 instead activates one or more portions of the redundant bit lines or redundant word lines in place of the defective bit lines or defective word lines.

The known DRAM chip 100 has the disadvantage that the active elements, such as the memory cell array 105, the row decoder section 102 or the column decoder section 103 may be reduced in size as smaller feature sizes are introduced which each new device generation, but the size of the fuse elements 104 cannot be reduced. Because laser cutting is used to "blow" the fuse elements, a minimum spacing is required between the fuse elements because of the finite spot size of the laser beam. Though the spot size of the beam may be reduced, the energy that is applied to the fuse element is also reduced, thereby increasing the possibility that a fuse element is not blown.

Additionally, to store all the fail address values, several-thousand fuse elements may be required on each chip and take up a significant portion of the surface area of the chip that therefore cannot be reduced in size.

Figure 2:
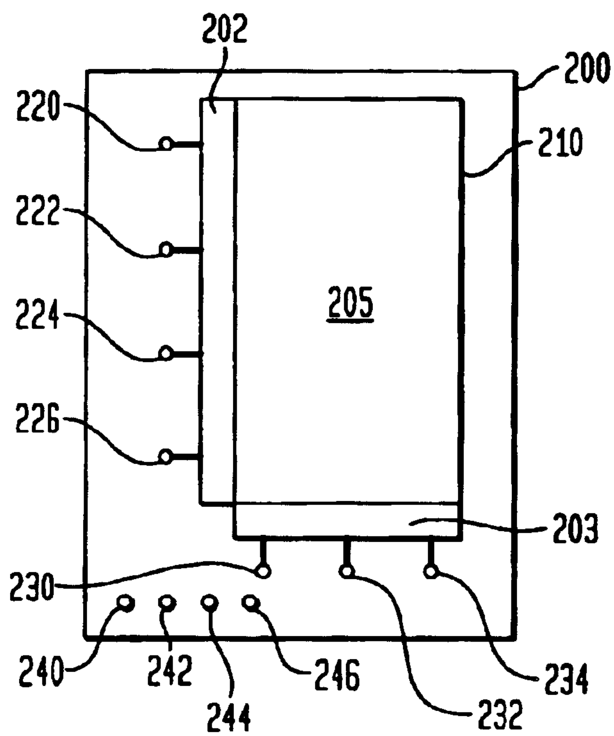
FIG. 2 is a diagram showing a top plan view of a front surface of a memory circuit chip in accordance with an aspect of the invention.

The present invention provides a DRAM chip or other device chip in which the fuse elements are provided on the backside of the chip. FIG. 2 illustrates an example of a front surface of a DRAM device 210 formed in a chip 200 in accordance with an aspect of the invention. The DRAM 210 writes data to or reads data from respective memory cells of a memory cell array 205 using a row decoder section 202 and a column decoder section 203 in the manner described above. However, in place of the fuse elements ordinarily located on the front surface of the chip, the fuse elements are arranged on the back surface of the chip. A plurality of openings allows interconnects to pass from the front surface of the chip to the back surface of the chip, such as openings 220,222,224,226, . . . through which interconnects pass from the row decoder section 202 on the front surface of the chip to to the fuse elements disposed on the back surface, openings 230,232,234, . . . through which interconnects pass from the column decoder section 203 on the front surface of the chip to the fuse elements on the back surface, and openings 240,242,244,246, . . . through which interconnects pass from other circuitry located on the front surface of the chip to the fuse elements on the back surface of the chip.

The openings through the chip may be generated by any of a number of techniques known in the art, such as chemical etching, laser-assisted etching, electron beam milling or focused ion beam etching. The interconnections through the openings may also be provided using methods known in the art, such as are used for printed circuit boards.

Figure 3:
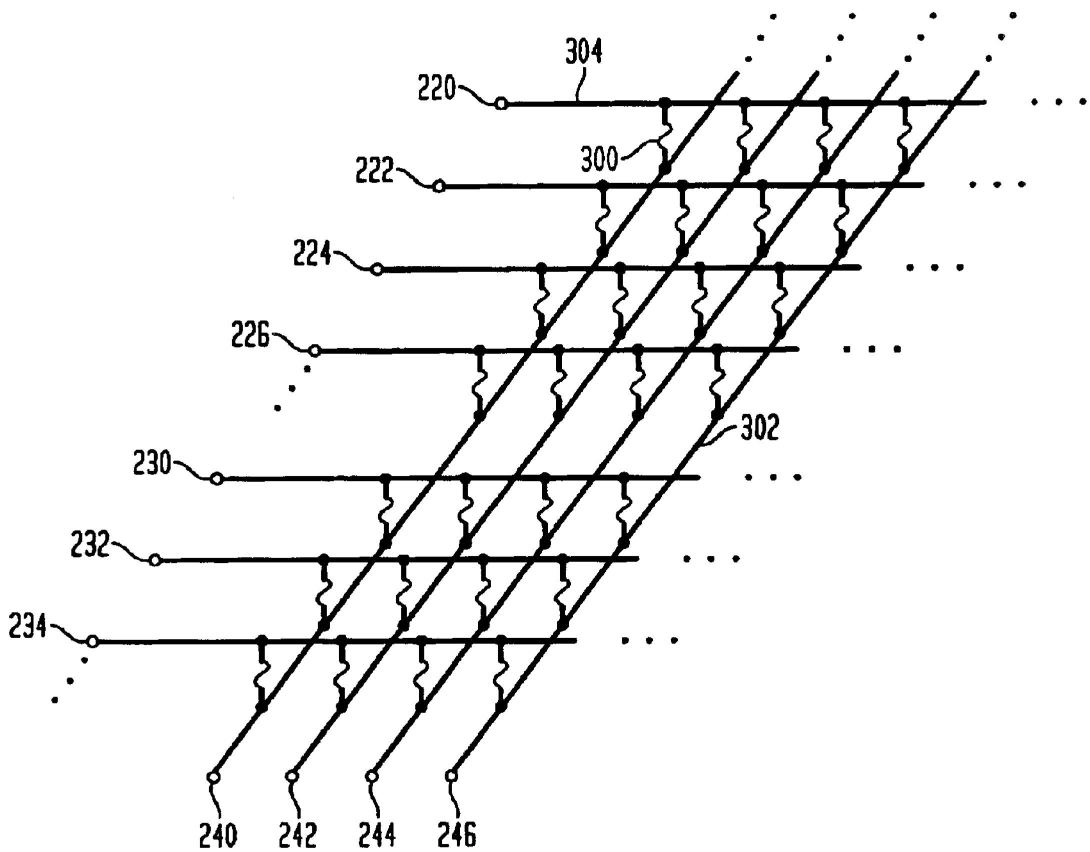
FIG. 3 is a schematic diagram showing the interconnection of programmable fuse elements formed on a back surface of the memory chip shown in FIG. 2.

FIG. 3 schematically illustrates an arrangement of the programmable fuse elements 300 on the back surface of the chip 200. The fuse elements 300 are arranged in a two-dimensional array, and each of the fuse elements 300 provide a unique connection between a respective one of input lines 302 and a respective one of output lines 304 which are also formed on the back surface of the chip. Each of the input lines 302 is connected via a respective one of the openings 240,242,244,246, . . . to control circuitry (not shown) located on the front side of the chip. Each of the output lines 304 is connected via a respective one of the openings 220,222,224,226, . . . to the row decoder section 202 or via a respective one of the openings 230,232,234, . . . to the column decoder section 203. The programmable fuse elements, the input lines and the output lines may be formed on the back surface of the chip using known processing methods.

The information stored in the fuse elements 300 is read by sequentially activating each of the input lines 302 and then reading the output generated at one of the output lines 304. As an example, to read the values stored in the uppermost row of fuses 300, an input line connected to the front surface of the chip through the opening 240 is activated, then an input line connected to the opening 242 is activated, an input line connected to the opening 244 is next activated, and thereafter an input line connected to the opening 246 is activated. As each of the input lines 302 is activated, an output is read at the line connected to opening 222. Similarly, the values stored in the second row of fuses are read from the outputs of the line connected to the opening 224, the values stored in the third row of fuses are read from the line connected to the opening 226, the values stored in the fourth row of fuses are read using the line connected to the opening 228, etc. Various circuitry known in the art may be incorporated on the front surface of the chip and connected to these openings to control the reading operation.

Figure 4:
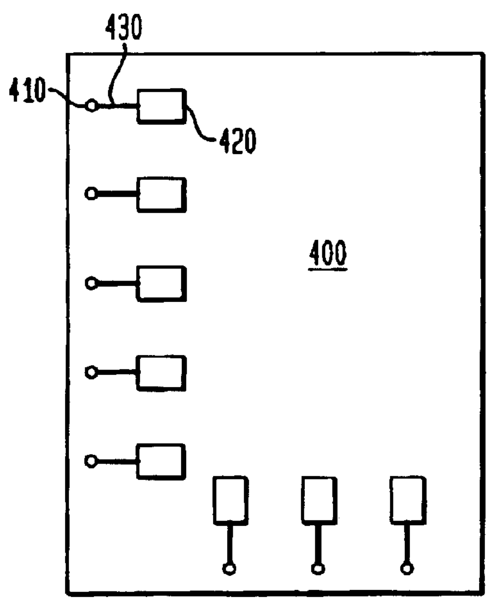
FIG. 4 is a diagram showing a top plan view of a back surface of a memory circuit chip in accordance with another aspect of the invention.

FIG. 4 illustrates an alternative embodiment of the invention in which bonding pads 420 of a DRAM circuit chip or other circuit chip are disposed on the back surface of a chip 400. A plurality of openings 410 that extend from the front surface of a chip to the back surface of a chip permit interconnection 430 to pass from the circuitry on the front surface of a chip to the bonding pads 420 on the back surface of the chip. FIG. 4 illustrates only one of many possible arrangements of the bonding pads on the back surface of a chip.

Advantageously, the invention allows for reductions in chip size without reducing the size or spacing of the fuse elements or the size or spacing of the bonding pads. As a result, a greater number of chips may be formed on a single wafer without sacrificing processing reproducibility or device reliability.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. An electronic device, having a first surface and a second surface formed in a single substrate, said device comprising:

a plurality of circuit elements formed in said first surface of said single substrate, said plurality of circuit elements including at least one active circuit element and at least one redundant circuit element;

at least one programmable fuse element formed in said second surface of said single substrate, said programmable fuse element storing, when said at least one active circuit element is defective, an indication thereof; and at least one interconnect connecting said plurality of circuit elements and said programmable fuse element.

2. The device of claim 1 further comprising at least one opening formed in said single substrate and extending between said first surface and said second surface; said interconnect passing through said opening.

3. The device of claim 1 further comprising a plurality of programmable fuse elements formed in said second surface of said substrate.

4. The device of claim 3 wherein said plurality of programmable fuses stores, when said at least one active circuit element is defective, an address thereof.

5. The device of claim 1 wherein said at least one programmable fuse element includes a two-dimensional array of programmable fuse elements and a plurality of leads arranged as rows and columns of a grid, each of said leads being connected to said front surface of said substrate by a respective interconnect, each of said programmable fuse elements providing a respective connection between a particular column lead and a particular row lead.

6. The device of claim 5 wherein values stored in a row of said array of programmable fuse elements are read by sequentially activating each column lead and reading an output on a respective row lead connected to said row of said array of programmable fuse elements.

7. The device of claim 1 wherein said at least one active circuit element comprises plurality of memory cells, and said at least one redundant circuit element is a redundant memory cell.

8. The electronic-device of claim 1 wherein said plurality of circuit elements formed in said first surface of said single substrate comprises a plurality of active memory cells and a plurality of redundant memory cells wherein said at least one programmable fuse element comprises a plurality of programmable fuse elements formed in said second surface of said single substrate; said plurality of programmable fuse elements storing, when said at least one of said plurality of active memory cells is defective, an address thereof; and wherein said at least one internet comprises a plurality of interconnects connecting said plurality of circuit elements and said programmable fuse elements.

9. The device of claim 8 further comprising a plurality of openings formed in said single substrate and extending between said first surface and said second surface; a respective one of said plurality of interconnects passing through a respective one of said plurality of openings.

10. The device of claim 8 wherein said plurality of programmable fuse elements is arranged as a two-dimensional array of programmable fuse elements, and said device further comprises a plurality of leads arranged as rows and columns of a grid, each of said leads being connected to said first surface of said substrate by a respective one of said plurality of interconnects, each of said programmable fuse elements providing a respective connection from a particular column lead to a particular row lead.

11. The device of claim 10 wherein values stored in a row of said array of programmable fuse elements are read by sequentially activating each column lead and reading an output on a respective row lead connected to said row of said array of programmable fuse elements.

12. An electronic device having a first surface and a second surface formed in a single substrate, said device comprising:

a plurality of circuit elements formed in said first surface of said single substrate;

at least one bonding pad formed in a second surface of said substrate; and at least one interconnect connecting said plurality of active circuit elements and said at least one bonding pad.

13. The device of claim 12 further comprising at least one opening formed in said substrate and extending between said first surface and said second surface; said interconnect passing through said at least one opening.

14. The device of claim 12 wherein said plurality of circuit elements includes a plurality of memory cells.

15. An electronic chip having a first surface and a second surface formed on a single semiconductor substrate, said electronic chip comprising:

a plurality of circuit elements formed on said first surface of said single semiconductor substrate, said plurality of circuit elements including at least one active circuit element and at least one redundant circuit element;

at least one programmable fuse element formed on said second surface of said single semiconductor substrate, said programmable fuse element storing an indication that said at least one active circuit element is defective;

at least one opening formed in said single semiconductor substrate and extending between said first surface and said second surface; and at least one interconnect passing through said at least one opening connecting said plurality of circuit elements and said programmable fuse element.

16. The device of claim 15 wherein said at least one programmable fuse element comprises a plurality of programmable fuse elements.

17. The device of claim 15 wherein said at least one programmable fuse element comprises a two-dimensional array of programmable fuse elements and a plurality of leads arranged as rows and columns of a grid, each of said leads being connected to said first surface of said single semiconductor substrate by a respective interconnect, each of said programmable fuse elements providing a respective connection between a particular column lead and a particular row lead.

18. The device of claim 16 wherein said plurality of circuit elements comprises a plurality of active circuit elements, and a plurality of redundant circuit elements.

19. The device of claim 18 wherein said plurality of active circuit elements comprises a plurality of memory cells and wherein said plurality of redundant circuit elements comprises a plurality of redundant memory cells.

* * * * *